United States Patent [19]
Graham

[11] Patent Number: 6,028,540
[45] Date of Patent: Feb. 22, 2000

[54] ENCODING/DETECTION METHOD FOR DIGITAL DATA

[75] Inventor: Martin H. Graham, Berkeley, Calif.

[73] Assignee: Tut Systems, Inc., Pleasant Hill, Calif.

[21] Appl. No.: 08/899,220

[22] Filed: Jul. 23, 1997

[51] Int. Cl.$^7$ .................................................. H03M 5/14
[52] U.S. Cl. ................................................ 341/72; 341/73
[58] Field of Search ................................. 341/70, 71, 72, 341/73, 74

[56] References Cited

U.S. PATENT DOCUMENTS

| | | | |
|---|---|---|---|
| 3,968,328 | 7/1976 | Tsuchiya et al. | 341/72 |
| 4,337,457 | 6/1982 | Tache | 34/57 |
| 4,410,877 | 10/1983 | Carasso et al. | 341/51 |
| 4,556,868 | 12/1985 | Harle | 341/73 |
| 4,617,553 | 10/1986 | Webster et al. | 341/58 |
| 5,144,469 | 9/1992 | Brahms et al. | 359/181 |

OTHER PUBLICATIONS

Digital Communication–2nd Ed., Lee & Messerschmitt, 1994, Chapter 12, Spectrum Control, pp. 558–568.
The Bell System Technical Journal, vol. XLI, Jan., 1962, PCM Transmission in the Exchange Plant, Aaron, pp. 99–141.
The Bell System Technical Journal, vol. XLI, Jan., 1962, A Bipolar Repeater for Pulse Code Modulation Signals, Mayo, pp. 25–97.
The Bell System Technical Journal, vol. XLIV, Oct., 1995, "Digital Transmission in the Pressure of Impulsive Noise," Engel, pp. 1699–1743.
"Certain Topics in Telegraph Transmission Theory," Nyquist, Transactions of the American Institute of Electrial Engineers, vol. 47, Apr. 1928, pp. 617–644.
"Bits and Pots Together," Graham, Memorandum No. UCS/ERL M97/45, Jul. 28, 1997, Electronics Research Laboratory, College of Engineering, University of California, Berkeley.

*Primary Examiner*—Marc S. Hoff
*Attorney, Agent, or Firm*—Blakely, Sokoloff, Taylor & Zafman, LLP

[57] ABSTRACT

A binary data encoding and decoding technique that alternates between starting polarities of a signal for both each occurrence of a binary 1 and each occurrence of two or more consecutive binary 0's. To encode a binary 1, the signal is one polarity for one-half of a bit interval and then the other polarity for the other half of the bit interval. To encode a binary 0, the signal remains at a zero level, unless there are two or more consecutive binary 0's, in which case the signal will be one polarity for the second half of the first binary 0 bit interval, the other polarity for the first half of the second binary 0 bit interval, and repeat this waveform for every for every two adjacent binary 0's. Decoding occurs by examination of either the signal level as compared to predetermined cut-levels, or the time equivalent distance between the peaks. In the first case, if the signal is above the upper cut-level or below the lower cut-level, a binary 1 is decoded; if it is between the upper cut-level and the lower cut-level a binary 0 is decoded. Alternatively, every occurrence of a peak is decoded as a binary 1 and the number of binary 0's between these binary 1's is determined by the time equivalent distance between peaks.

14 Claims, 6 Drawing Sheets

ENCODING/DETECTION METHOD FOR DIGITAL DATA

BACKGROUND OF THE INVENTION

1. Field of the Invention

The invention relates to the field of digital data encoding and decoding.

2. Prior Art

Some digital data encoding techniques use three signal levels to encode two digital states. For instance, Biphase encoding uses a zero (intermediate) signal level to represent a binary 0 and a combination of both positive (high) and negative (low) signals to represent a binary 1. This is achieved in the absence of any DC component independent of the data. However, since binary 0's are represented by a constant intermediate signal, no timing information is transmitted during periods where the data consists of consecutive 0's.

In contrast, the Return-To-Zero Alternate Mark Inversion (RZ-AMI) encoding is the bipolar format used in the "T1" standard and implements a slightly different scheme. Similar to Biphase encoding, RZ-AMI uses a zero signal level to represent a binary 0. However, a binary 1 is represented by a method of alternating high and low signals, which will later be shown, and alternating polarities. Here again, there are no DC components independent of the data and timing information is not transmitted during periods of consecutive 0's.

Another three level encoding scheme is the Non-Return-To-Zero Alternate Mark Inversion (NRZ-AMI). As in Biphase and RZ-AMI, NRZ-AMI uses a zero signal level to represent a binary 0. A binary 1 is represented by a signal alternating between remaining high or low for an entire bit interval. Similar to RZ-AMI encoding, upon the occurrence of a binary 1, NRZ-AMI encoding is alternated to achieve the elimination of DC components independent of the data. Nevertheless, NRZ-AMI encoding also fails to transmit timing information during periods of consecutive 0's.

One common method of decoding digital signals is based on determining whether the amplitude of the signal is above or below predetermined cut-levels. Cut-levels are simply threshold voltages determined by the system designer. In a three-level system (e.g. Biphase), two cut-levels are necessary. For example, when decoding a Biphase signal, if the signal is above the upper predetermined cut-level, or below the lower predetermined cut-level, the result is a binary 1. If the signal is between the two cut-levels, the result is a binary 0.

The problem with this method becomes apparent when long strings of binary 0's are encoded. During this time, the signal remains at approximately a zero level. This results in extended periods of no timing information being transmitted and consequently shifted bit intervals. One way to remedy this problem is commonly known as "stuffing.""Stuffing" requires an entirely different decoding scheme based on the location of, and time equivalent distance (TED) between, the maxima and minima in the signal (rather than the magnitude of the amplitude). Maxima occur when the slope of the signal changes from positive to negative and minima occur when the slope changes from negative to positive. By ascertaining the location of the maxima and minima in the signal, and the TED between them, various "modes" may be engaged as described in the DETAILED DESCRIPTION OF THE PRESENT INVENTION section. The end result is the transmittal of timing information, even during strings of binary 0's.

The properties of these systems as well as others, are discussed in *Digital Communication-Second Edition*, by Edward A. Lee and David G. Messerschmitt, published by Kluwer Academic Publishers (1994) particularly in Chapter 12 entitled: "Spectrum Control". Additional information pertaining to these systems may be found in *Digital Transmission Systems*, by David R. Smith, published by Van Norstrand, Reinhold Company (1985) particularly in Chapter 5 entitled: "Baseband Transmission".

Due to distortion and attenuation, digital signals are often altered during transmission. One common undesirable result is baseline wander wherein the decoded signal's zero level begins to drift above or below the actual zero level. One solution to this problem, employed by Biphase encoding, is to utilize a pulse shape having a zero integral.

Another design consideration regarding signal distortion and attenuation is the essential high frequency ($f_{high}$). This is the number of cycles per second for a series of all 1's. For Biphase encoding, $f_{high}$=bits per second, whereas for NRZ-AMI and R-ZAMI encoding, $f_{high}$=(bits per second)÷2 or half the bandwidth required for Biphase encoding.

Other design considerations include whether the chosen encoding method is "self-equalizing"—the tail of the positive-going pulse is effectively canceled by the tail of the negative-going pulse—and the degree to which timing recovery can be simplified. Biphase encoding is "self-equalizing" and since there is a zero crossing in every 1 bit interval, timing recovery is made easy when there are no periods of consecutive 0's. Despite these advantages, and for the same reasons they exist, Biphase encoding requires about twice the bandwidth as NRZ-AMI or RZ-AMI encoding.

As will be seen, the present invention not only provides the advantages of "self-equalization" and simplified timing recovery regardless of the bit pattern, but also is even more effective in reducing baseline wander than Biphase encoding. This is true because the tail of a signal employing the present invention is inherently shorter than the tail of a signal encoded via Biphase. Further, the essential high frequency of the present invention is half of that of Biphase encoding and thus has the above features without requiring a greater transmission bandwidth than NRZ-AMI or RZ-AMI encoding. By employing the "stuffing" technique (discussed above) in conjunction with the present invention, optimal encoding and decoding of digital signals is achieved. Other advantages of the present invention include: lower hardware costs, lower power requirements, and lower data link startup time.

SUMMARY OF THE INVENTION

A method is described for encoding and decoding binary data states, as they occur during bit intervals, in a signal having three predetermined levels. In the case of encoding a binary 1, the following steps are alternated: (i) a signal starts at a high level at approximately the beginning of a bit interval, then shifts to a low level at approximately midway of the bit interval and remains there for approximately the remainder of the bit interval, and (ii) a signal starts at a low level at approximately the beginning of a bit interval, then shifts to a high level at approximately midway of the bit interval and remains there for approximately the remainder of the bit interval. A binary 0 is encoded when the signal remains at approximately the intermediate level for approximately the entire bit interval.

An alternate embodiment of encoding via the present invention employs a technique commonly known in the art as "stuffing." When this technique is employed, decoding requires analysis of the location of the maxima and minima in the signal (instead of the amplitude) and the time equivalent distance (TED) between them.

DETAILED DESCRIPTION OF THE PRESENT INVENTION

A method for encoding and decoding binary data is described. In the following description, numerous well-known circuits and techniques are not described in detail in order to avoid unnecessarily obscuring the present invention. In other instances, specific waveforms and circuits are provided in order to provide a thorough understanding of the present invention. It will be apparent, however, to one skilled in the art that the present invention may be practiced without these specific details.

Two methods of employing the present invention are the "cut-level" method and the "time-equivalent-distance-between-maxima and minima" method, both of which are introduced in the Prior Art section above, and discussed in further detail below. The intricacies of both embodiments are discussed in detail below.

Figure 1:
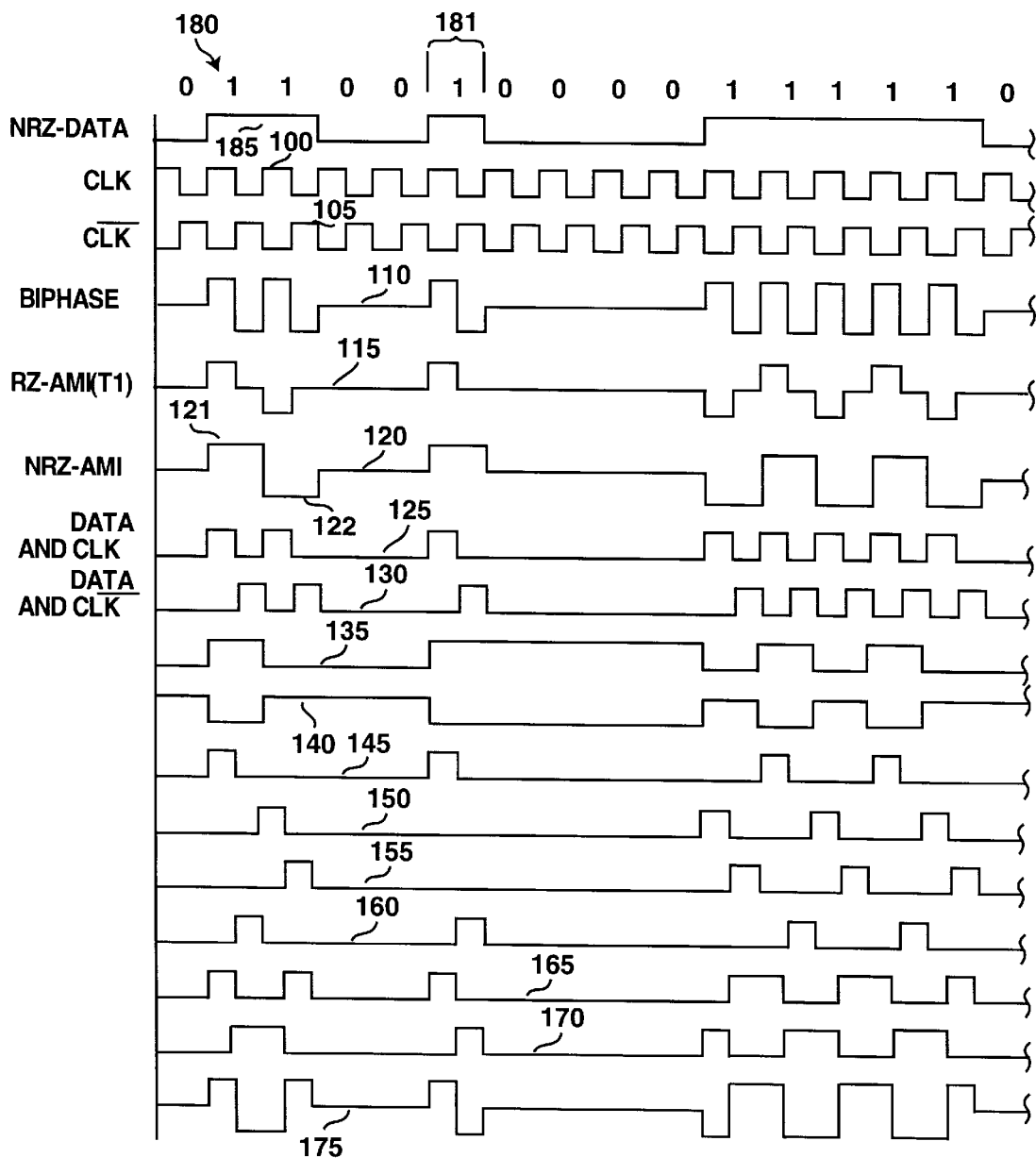
FIG. 1 illustrates a plurality of signals used to describe the prior art and one embodiment of the present invention as well as the behavior of a signal, for a given bit stream, at various stages in the circuitry illustrated in FIG. 2.

Referring first to the "cut-level" embodiment, FIG. 1 illustrates a bit stream 180 of digital data is represented by zeros and ones. Several of the waveforms below bit stream 180 illustrate various methods of encoding the data represented by the bit stream 180 while other waveforms illustrate the behavior of a signal, representing the bit stream 180, at various stages of the circuitry in FIG. 2.

Waveform 100 represents a clocking signal with a period equal to the bit interval 181 shown for the various waveforms of FIG. 1. Waveform 105 is the complement of this clocking signal.

The bit stream 180 is represented by waveform 185 using the well-known encoding method Non-Return-To-Zero (NRZ). This waveform has two levels: the lower level indicating a binary 0 and the upper level a binary 1.

Waveform 110 illustrates Biphase encoding, another well-known encoding scheme, wherein three discrete signal levels are used: a zero (intermediate) level, a positive (high) level and a negative (low) level. A binary 1 is represented by a sequence of the positive and negative levels while a binary 0 is represented by the zero level. With this encoding, a transition occurs with each binary 1 at which time the signal is positive for half of a bit interval 181, negative for the other half. As a result, the DC component is eliminated.

The NRZ-AMI waveform 120 represents a binary 1 by either a positive or negative level while a binary 0 is represented by the zero level. The NRZ-AMI waveform 120 transitions with each binary 1 and the positive and negative levels are alternated to avoid a DC component in the signal. By way of example, the first two binary ones of the bit stream 180 cause a transition to the positive level 121 and then to the negative level 122.

The RZ-AMI waveform 115, used in the well-known "T1" carrier system, is different from the NRZ-AMI waveform 120 only in that, for the case of a binary 1, it shifts back to a zero state midway through a bit interval 181 and remains there for approximately the duration of the bit interval 181.

The present invention combines the Biphase characteristic of occupying two levels per bit interval and the alternating polarity characteristic of the AMI waveforms 115 and 120. Encoding employing the present invention is illustrated by a waveform 175.

To represent a binary 1, encoding via the present invention behaves similarly to a Biphase representation 110 in that the present invention sustains a positive level for approximately the first half of the bit interval 181, shifting to a negative level for approximately the second half of the bit interval 181. However, unlike Biphase encoding 110, encoding by way of the present invention alternates between a high then low level and a low then high level. This alternating is illustrated by the two consecutive ones 176 and the series of consecutive ones 177 in the bit stream 180.

Figure 2:
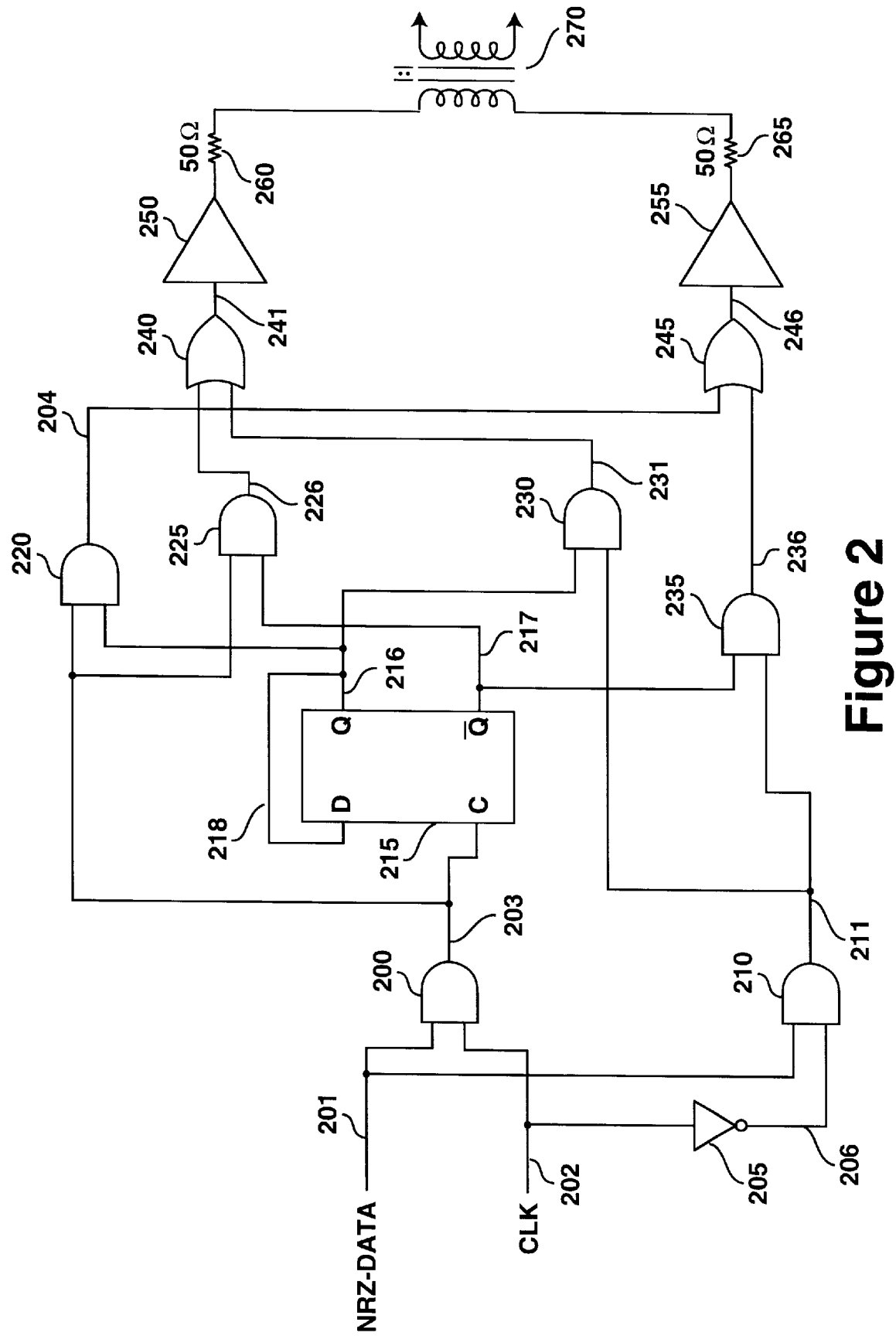
FIG. 2 illustrates an electrical schematic showing one embodiment of an encoder of the present invention.

A circuit for providing the waveform 175 is illustrated in FIG. 2. The data represented by waveform 185 is coupled by line 201 to an input terminal of two AND gates 200 and 210. The clocking signal represented by waveform 100 is coupled by a line 202 to the other input terminal of the AND gate 200 and to the input terminal of an inverter 205. Waveform 105 represents the signal at the output 206 of the inverter 205.

Waveform 125 represents the signal at the output 203 of AND gate 200. This output 203 is coupled to one input terminal of AND gates 220 and 225 as well as the clock terminal of flip-flop 215. Waveform 130 represents the signal at the output 211 of AND gate 210. This output 211 is coupled to an input terminal of AND gates 230 and 235.

Waveform 135 represents the signal at the Q terminal 217 of flip-flop 215. The Q terminal is coupled to the other input terminals of AND gates 225 and 235. Waveform 140 represents the signal at the Q-bar terminal 216 of flip-flop 215. The Q-bar terminal 216 is coupled to the D terminal 218 and to the other inputs of AND gates 220 and 230. The connection between the Q-bar terminal 216 of flip-flop 215 and the D terminal 218 of flip-flop 215 assures that the positive going and negative going transitions from the zero level alternate.

Waveform 150 represents the signal at the output 221 of AND gate 220. This output 221 is coupled to one input of an OR gate 245. Waveform 145 represents the signal at the output 226 of AND gate 225. This output 226 is coupled to one input of an OR gate 240.

Waveform 155 represents the signal at the output 231 of AND gate 230. This output 231 is coupled to the other input of OR gate 240. Waveform 160 represents the signal at the output 236 of AND gate 235. This output 236 is coupled to the other input of OR gate 245.

Waveform 165 represents the signal at the output 241 of OR gate 240. This output 241 is coupled to the input of a buffer 250 which is in turn coupled serially to a 50 Ω resistor 260, in turn coupled to a transformer 270. The transformer 270 has a ratio of 1:1. Waveform 170 represents the signal at the output 246 of OR gate 245. This output 246 is coupled to the input of another buffer 255 which is in turn coupled serially to another 50 Ω resistor 265, in turn coupled to transformer 270. Waveform 175, one embodiment of the present invention, is the analog difference between outputs 241 and 246.

It should be noted that for the particular positive and negative transitions shown in waveform 175, it is assumed that the flip-flop 215 is in the state shown. However, this is really not significant since if the flip-flop 215 were in its other state the waveform 175 would simply be reversed; that is, all the positive pulses would become negative pulses, and all the negative pulses would become positive pulses.

Figure 3:
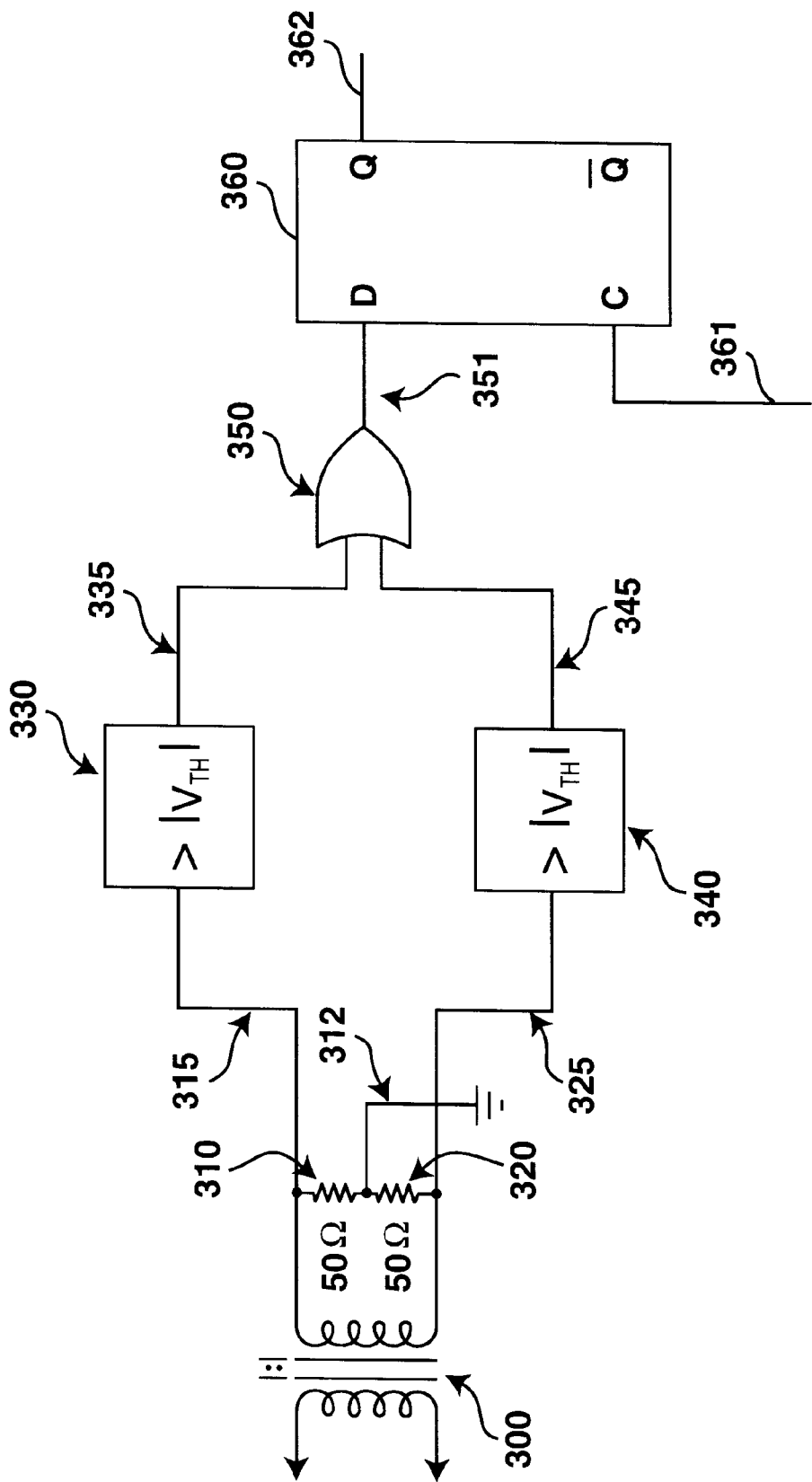
FIG. 3 illustrates an electrical schematic showing one embodiment of a decoder of the present invention.

FIG. 3 depicts the "cut-level" method circuitry for decoding a signal encoded via the present invention. A transformer 300 is coupled, in parallel, to two 50 Ω resistors 310 and 320 having a grounded line 312 between them. Consequently, positive voltages will appear on line 315 while negative voltages will appear on line 325. Lines 315 and 325 are coupled to comparators 330 and 340 respectively. These comparators 330 and 340 have internal buffers and will yield a binary 1 output it the absolute value of the input voltage is above a predetermined threshold voltage. The outputs 335 and 345 are coupled to the input terminals of an OR gate 350 such that if the signal being decoded is above the absolute value of the predetermined threshold voltage, the output 351 of OR gate 350 will be high. This output 351 is coupled to the D terminal of a flip-flop 360. The clock terminal of flip-flop 360 receives a signal from a local receive clock (such as derived from a phase locked loop clock recovery circuit) wherein the positive edge of the clock signal is synchronized with the sampling time. This yields an NRZ signal at the output 362 of flip-flop 360.

Figure 4:
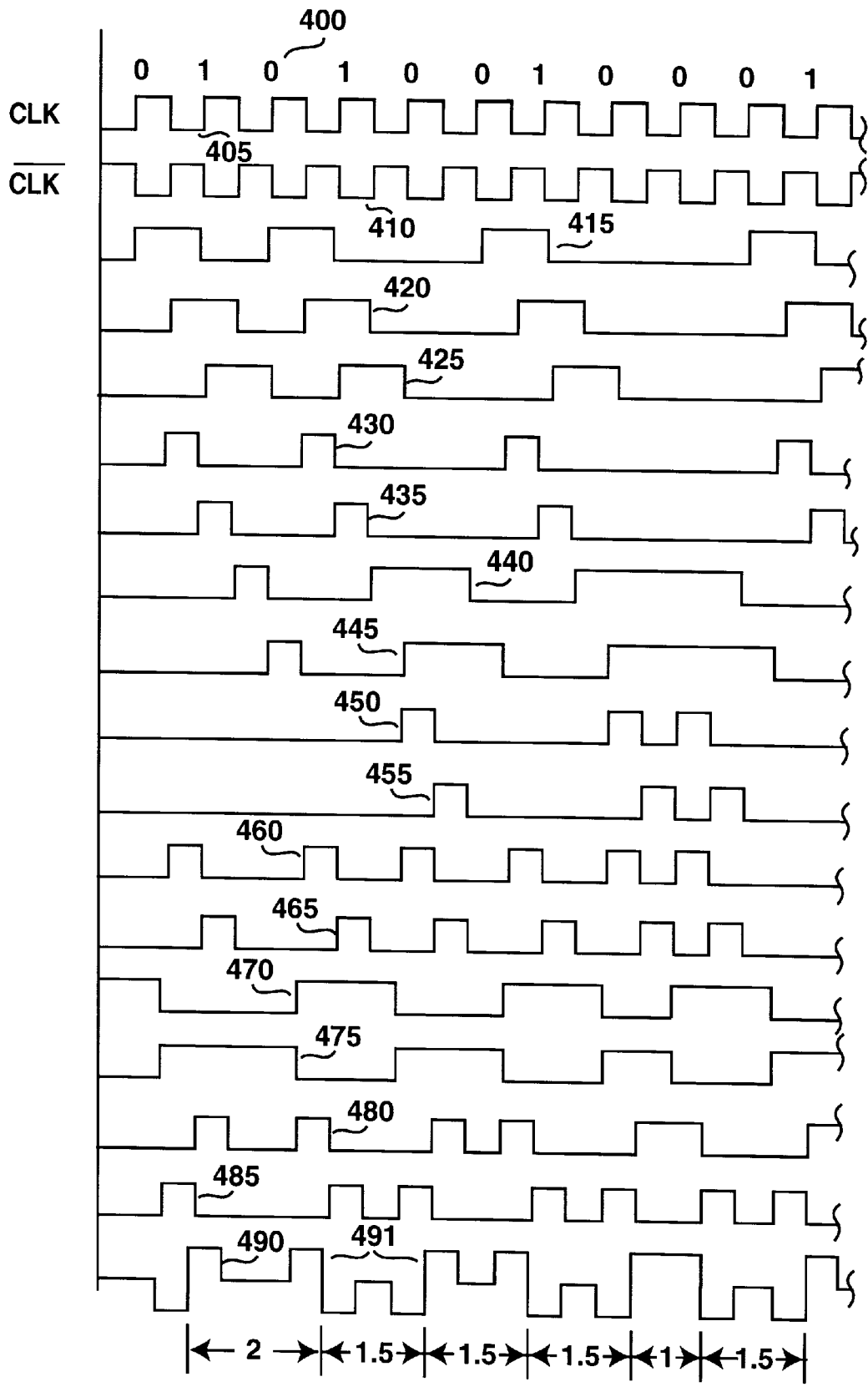
FIG. 4 illustrates a plurality of signals used to describe the behavior of a signal, for a given bit stream, at various stages in the circuitry illustrated in FIG. 5.

As discussed in the Prior Art section, retrieval of timing information when decoding strings of binary 0's can be accomplished by employing a "stuffing" technique during encoding. This "stuffing" technique anticipates two consecutive binary 0's. Upon their occurrence, a signal comparable to that used to encode a binary 1 is generated with its maxima (or minima) located on the line between the two binary 0 bit intervals as illustrated in FIG. 4. The "stuffing" technique complements the present invention in an embodiment referred to herein as the "time-equivalent-distance-between-maxima and minima or TED. It should be noted that the polarity of the "stuffing" signal and that of a binary 1 is alternated between 491 as illustrated in FIG. 4.

The respective decoding scheme can be described as follows: In an initial mode, when the TED between consecutive maxima and minima is equal to one bit interval, this indicates a binary 1; when the TED is equal to two bit intervals, this indicates the binary string 101; when the TED is equal to one and one-half bit intervals, this indicates two consecutive binary 0's and consequently shifts the system to an alternate mode. While in this alternate mode, when the TED is equal to one bit interval, this indicates a binary 0; when the TED is equal to one and one-half bit intervals, this indicates a binary 1 and consequently shifts the system back to the initial mode.

Referring to FIG. 4, a bit stream 400 of digital data is represented by zeros and ones. The bit stream 400 is represented by the waveform 420 using the NRZ encoding method. Waveforms 405 and 410 illustrate a clock signal and its complement respectively. The other waveforms below bit stream 400 illustrate the signal representing bit stream 400 at various stages of the circuitry in FIG. 5.

Figure 5:
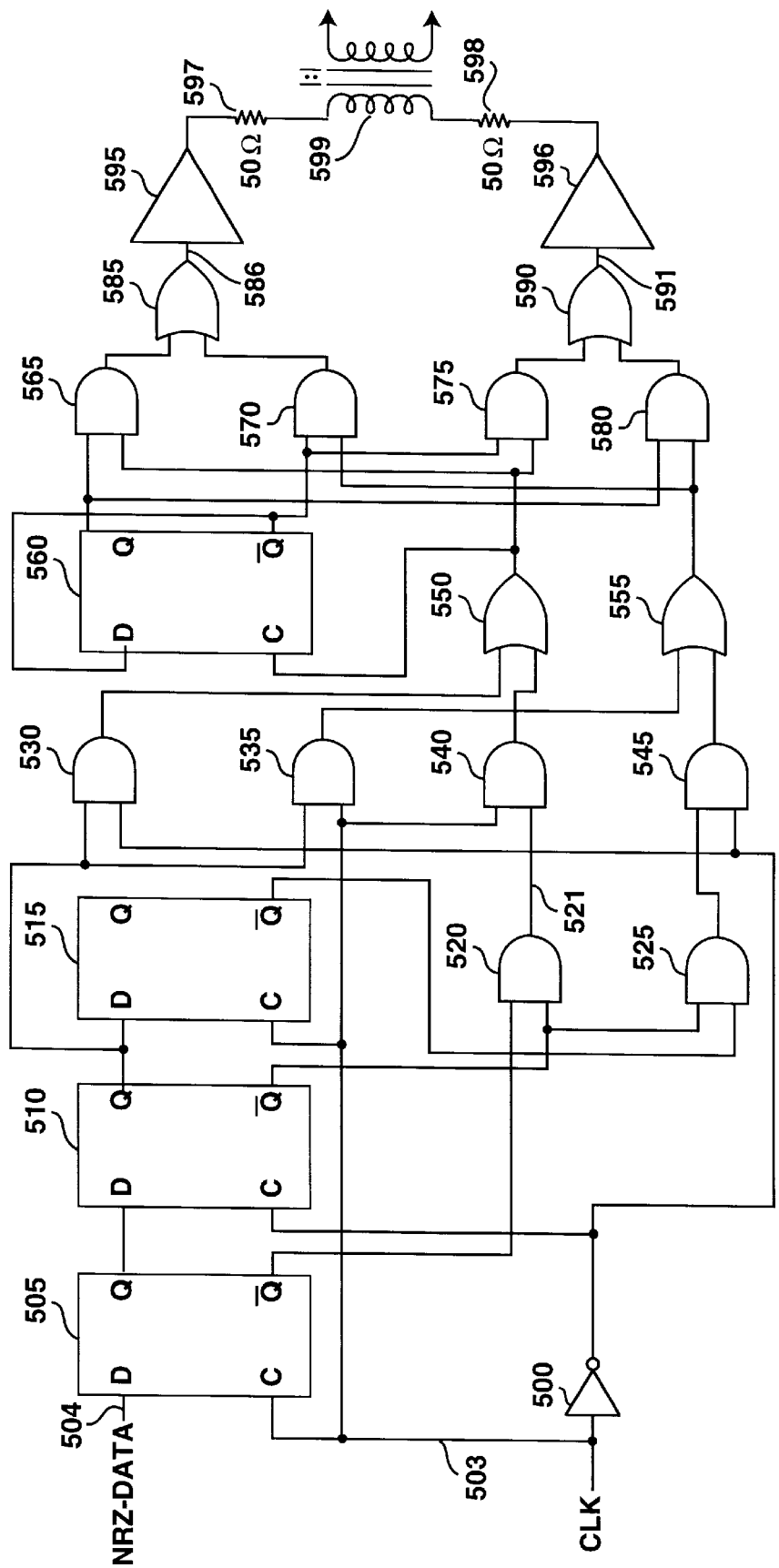
FIG. 5 illustrates an electrical schematic showing an alternate embodiment of an encoder of the present invention.

A circuit for providing the waveform 490, an alternate embodiment of the present invention, is illustrated in FIG. 5. The data represented by waveform 420 is coupled by a line 504 to a D terminal of a flip-flop 505. The clocking signal represented by waveform 405 is coupled by a line 503 to the clock terminal of flip-flop 505, the input of an inverter 500, the clock terminal of a flip-flop 515, one of the input terminals of an AND gate 535, and one of the input terminals of an AND gate 540. Waveform 410 represents the signal at the output of inverter 500 which is coupled to the clock terminal of a flip-flop 510, one of the input terminals of an AND gate 530, and one of the input terminals of an AND gate 545.

Whereas the Q terminal of flip-flop 510 provides the data as synchronized with waveform 490, flip-flop 505 anticipates the upcoming bit—a function necessary to employ the "stuffing" technique discussed above—as illustrated by a waveform 415 in FIG. 4. Similarly, flip-flop 515 generates a delayed signal, illustrated by waveform 425 in FIG. 4, also necessary to employ the "stuffing" technique. Consequently, the Q-bar terminal of flip-flop 505 is coupled to one input terminal of an AND gate 520, the Q-bar terminal of flip-flop 510 is coupled to the other input of AND gate 520 as well as to one of the input terminals of an AND gate 525, and the Q-bar terminal of flip-flop 515 is coupled to the other input terminal of AND gate 525. Further, the Q terminal of flip-flop 505 is coupled to the D terminal of flip-flop 510 and the Q terminal of flip-flop 510 is coupled to the D terminal of flip-flop 515 as well as the other input terminal of AND gate 530 and the other input terminal of AND gate 535.

The output terminal of AND gate 530 is coupled to one of the input terminals of an OR gate 550 and the output terminal of AND gate 535 is coupled to one of the input terminals of an OR gate 555. Waveforms 430 and 435 represent the signal at the output terminals of AND gates 530 and 535 respectively. The output terminal 521 of AND gate 520 is coupled to the other input terminal of AND gate 540 and it should be noted that when output terminal 521 is high, this is an indication that two consecutive binary 0's are being encoded. The output terminal of AND gate 525 is coupled to the other input terminal of AND gate 545. The output terminal of AND gate 540 is coupled to the other input terminal of OR gate 550 and the output terminal of AND gate 545 is coupled to the other input terminal of OR gate 555. Waveforms 440, 445, 450, and 455 represent the signal at the output terminals of AND gates 520, 525, 540, and 545 respectively.

A flip-flop 560 provides the alternating polarity characteristic of the signal and receives the output signal from OR gate 550 at its clock terminal. The output from OR gate 550 also is coupled to both one input terminal of an AND gate 575 and one input terminal of an AND gate 565. The Q-bar terminal of flip-flop 560 is coupled both as a feedback its own D terminal and to one input terminal of AND gates 570 and 575. The output terminal of AND gate 555 is coupled to the other input terminal of AND gate 570 and one input terminal of an AND gate 580. The Q terminal of flip-flop 560 is coupled to the other input terminals of AND gates 565 and 580. Waveforms 460 and 465 represent the signal at the output terminals of OR gates 550 and 555 respectively while waveforms 470 and 475 represent the signal at the Q and Q-bar terminals of flip-flop 560 respectively.

The output terminals of AND gates 565 and 570 are coupled to one and the other input terminals of OR gate 585. Similarly, the output terminals of AND gates 575 and 580 are coupled to one and the other input terminals of OR gate 590. The output terminals 586 and 591 of OR gates 585 and 590 are coupled to the input terminals buffers 595 and 596 respectively, which are in turn respectively coupled to resistors 597 and 598, both with a resistance of 50 Ω.

Resistors 597 and 598 are coupled to a transformer 599 which has a ratio of 1:1. Waveforms 480 and 485 represent the signal at the output terminals of OR gates 585 and 590 respectively while waveform 490, an alternate embodiment of the present invention, is the analog difference between these two signals 480 and 485. The TED's 495 for waveform 490 are illustrated immediately below waveform 490.

Figure 6:
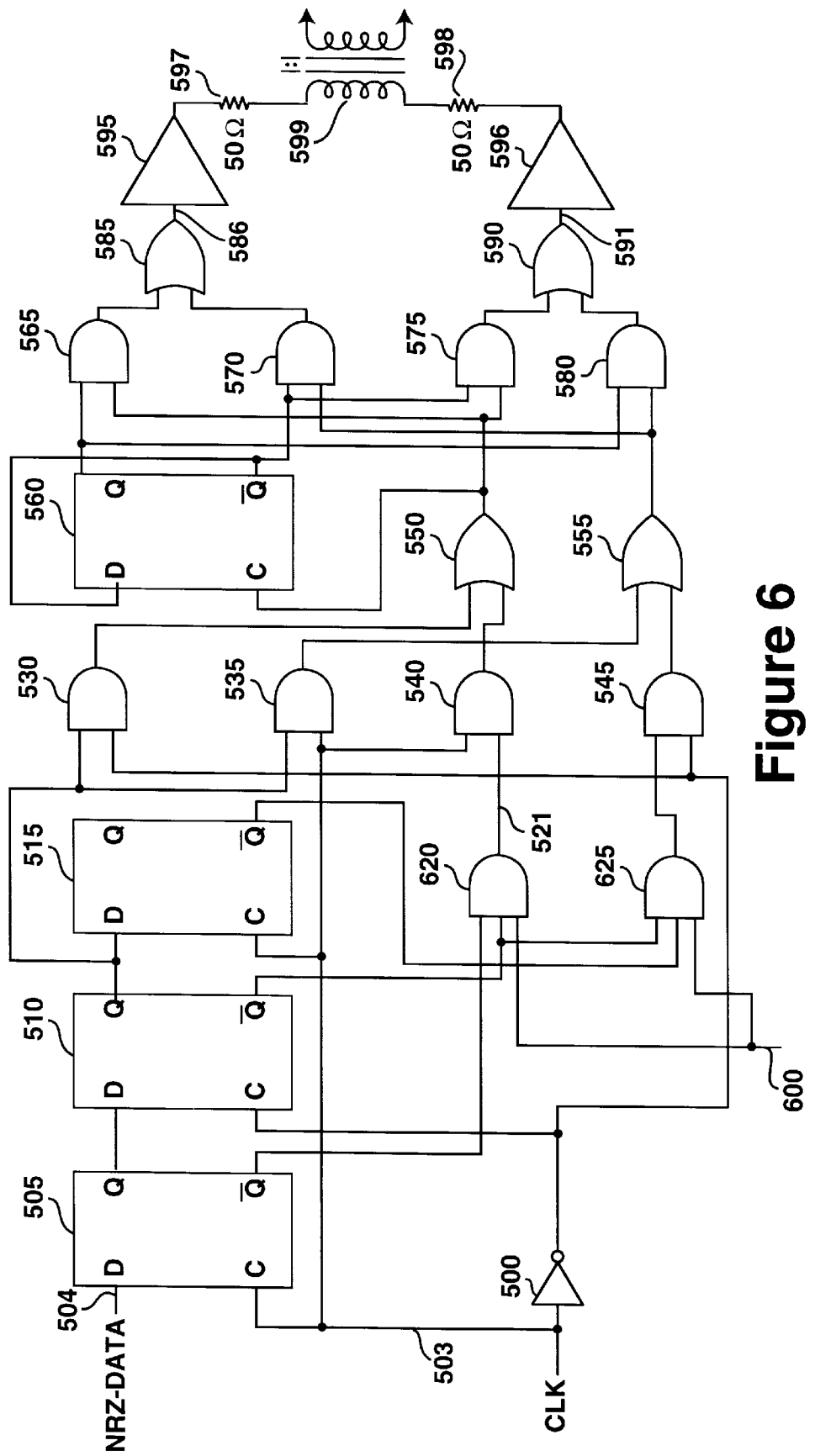
FIG. 6 illustrates an additional embodiment of an encoder of the present invention.

As described above, it's not possible for the TED to be equal to two bit intervals while in the alternate mode. However, if the application calls for a additional mode, this may be achieved by making the adaptations illustrated in FIG. 6. FIG. 6 is identical to 20 FIG. 5 except for the fact that AND gates 620 and 625 have three input terminals wherein one input terminal from each AND gate 620 and 625 is coupled together to form a single terminal 600. The single terminal 600 makes possible an additional mode as explained below. As long as the single terminal 600 is kept at a high level, the circuit will toggle between the initial mode and the alternate mode as described above. However, when the single terminal 600 is at a low level, the circuit operates comparably to that of the first embodiment described above—i.e. the "stuffing" technique is not employed. Thus when the TED between maxima and minima is equal to two and one-half or more bit intervals, the decoder will recognize that the additional mode has been engaged. This additional mode may be used, for example, as an additional control character.

Thus, a method for encoding and decoding binary data states has been described.

I claim:

1. A method for encoding a binary data state, occurring during bit intervals, in a signal having three predetermined levels of high, low, and intermediate, comprising the steps of:

alternating between each of the following for each successive occurrence of said binary data state:
   (a) a first signal at said high level at approximately the beginning of one of said bit intervals, transitioning to said low level at approximately midway in said bit interval, and remaining at said low level for approximately the remainder of said bit interval; and
   (b) a second signal at said low level at approximately the beginning of another of said bit intervals, transitioning to said high level at approximately midway in said bit interval, and remaining at said high level for approximately the remainder of said bit interval; and encoding the other binary data state in a third signal remaining at approximately said intermediate level for approximately an entire one of said bit intervals.

2. A method for decoding binary data, occurring during bit intervals, in a signal having three predetermined levels of high, low, and intermediate, comprising the steps of:

recognizing either of the following as one binary data state when it occurs during one of said bit intervals:
   (a) a first signal at said high level at approximately the beginning of one of said bit intervals, transitioning to said low level at approximately midway in said bit interval, and remaining at said low level for approximately the remainder of said bit interval; or
   (b) a second signal at said low level at approximately the beginning of another of said bit intervals, transitioning to said high level at approximately midway in said bit interval, and remaining at said high level for approximately the remainder of said bit interval; and generating a signal representative of said binary data state; and recognizing as the other binary data state a third signal at said intermediate level for approximately an entire one of said bit intervals.

3. The method defined in claim 2 wherein said recognition comprises the steps of:

sampling said signal at approximately midway in said bit intervals, and then determining if the sample is a predetermined magnitude above or below said intermediate level.

4. A method for encoding binary data states, occurring during bit intervals, comprising the steps of:
   (a) generating a first signal representing one binary data state, having a high level at approximately the beginning of one of said bit intervals, transitioning to a low level at approximately midway in said bit interval, and remaining at said low level for approximately the remainder of said bit interval;
   (b) generating a second signal representing said one binary data state, having a low level at approximately the beginning of another one of said bit intervals, transitioning to a high level at approximately midway in said bit interval, and remaining at said high level for approximately the remainder of said bit interval; and
   (c) generating a third signal representing the other binary data state and remaining at approximately an intermediate level for approximately an entire one of said bit intervals.

5. The method defined in claim 4 wherein said first signal is alternated with said second signal.

6. The method defined in claim 4 further comprising:

generating a fourth signal, occurring during a first and a second of two consecutive bit intervals, representing an occurrence of at least two consecutive said other binary data states, having a zero level at approximately the beginning of said first bit interval, transitioning to a high level at approximately midway of said first bit interval, transitioning to a low level at approximately the end of said first bit interval, transitioning to said zero level at approximately midway in said second bit interval, and remaining at said zero level for approximately the remainder of said second bit interval; and generating a fifth signal, occurring during a first and a second of two consecutive bit intervals, representing an occurrence of at least two consecutive said other binary data states, having a zero level at approximately the beginning of said first bit interval, transitioning to a low level at approximately midway of said first bit interval, transitioning to a high level at approximately the end of said first bit interval, transitioning to said zero level at approximately midway in said second bit interval, and remaining at said zero level for approximately the remainder of said second bit interval.

7. The method defined in claim 6 further comprising:

alternating between said fourth signal and said fifth signal;

alternating between said fourth signal and said second signal; and alternating between said fifth signal and said first signal.

8. A method for decoding binary data states, occurring during bit intervals, comprising the steps of:
   (a) recognizing a first signal representing one binary data state, having a high level at approximately the beginning of one of said bit intervals, transitioning to a low level at approximately midway in said bit interval, and remaining at said low level for approximately the remainder of said bit interval;

(b) recognizing a second signal representing said one binary data state, having a low level at approximately the beginning of another one of said bit intervals, transitioning to a high level at approximately midway in said bit interval, and remaining at said high level for approximately the remainder of said bit interval; and (c) recognizing a third signal representing the other binary data state and remaining at approximately an intermediate level for approximately an entire one of said bit intervals.

9. The method defined in claim 8 wherein said first signal is alternated with said second signal.

10. A method for decoding a binary data state, occurring during bit intervals, in a signal having varying slope, comprising the steps of:

recognizing either of the following as said binary data state when it occurs during one of said bit intervals:
(a) a first signal having a positive slope at approximately the beginning of one of said bit intervals, said positive slope then decreasing in magnitude such that said signal has a zero slope at approximately midway in said bit interval, said signal then transitioning to a negative slope and said negative slope increasing in magnitude for approximately the remainder of said bit interval; or
(b) a second signal having a negative slope at approximately the beginning of one of said bit intervals, said negative slope then decreasing in magnitude such that said signal has a zero slope at approximately midway in said bit interval, said signal then transitioning to a positive slope and said positive slope increasing in magnitude for approximately the remainder of said bit interval; and generating a signal representative of said binary data state; recognizing as the other binary data state a third signal having approximately zero slope for approximately an entire one of said bit intervals.

11. The method defined in claim 10 wherein said signal transitions from one polarity to another are defined as maxima and minima.

12. The method defined in claim 11 further comprising:
establishing a plurality of modes determined by the distance between said maxima and minima.

13. The method defined in claim 12 wherein a first and a second one of said modes are alternated between upon each occurrence of said distance between said maxima and minima being equal to a time equivalent of one and one-half of said bit intervals.

14. The method defined in claim 13 wherein a third mode is engaged upon the occurrence of said distance between said maxima and minima being equal to a time equivalent of at least two and one-half of said bit intervals.

* * * * *